United States Patent [19]

Tiwari

[11] Patent Number: 6,069,819
[45] Date of Patent: May 30, 2000

[54] VARIABLE THRESHOLD VOLTAGE DRAM CELL

[75] Inventor: Sandip Tiwari, Ithica, N.Y.

[73] Assignee: International Business Machines Corp., Armonk, N.Y.

[21] Appl. No.: 09/392,679

[22] Filed: Sep. 9, 1999

[51] Int. Cl.[7] ................................................. G11C 11/24
[52] U.S. Cl. ..................... 365/149; 365/145; 257/297; 257/300; 257/302; 257/303; 257/306; 257/295
[58] Field of Search ................................. 365/149, 145; 257/297, 298, 300, 301, 302, 303, 306, 295, 296

[56] References Cited

U.S. PATENT DOCUMENTS

| | | | |
|---|---|---|---|
| 4,704,705 | 11/1987 | Womack | 365/149 |
| 5,978,294 | 11/1999 | Ueno et al. | 365/210 |

Primary Examiner—Andrew Q. Tran
Attorney, Agent, or Firm—Fleit, Kain, Gibbons, Gutman & Bongini P.L.

[57] ABSTRACT

A memory cell is provided that includes a transistor and a capacitor. The transistor has a gate, a drain, a source, and a back-plane gate, and the capacitor has first and second electrodes. The back-plane gate of the transistor is connected to the first electrode of the capacitor. In a preferred embodiment, the source of the transistor is also connected to the first electrode of the capacitor. Additionally, a memory cell is provided that includes a transistor and a capacitor. The transistor has a gate, a drain, a source, and a back-plane gate, and the capacitor has first and second electrodes. The first electrode of the capacitor is connected to the source of the transistor, and the back-plane gate changes the threshold voltage of the transistor in correspondence to charge stored on the capacitor. In one preferred embodiment, the back-plane gate is charged from the transistor by a tunneling process.

20 Claims, 4 Drawing Sheets

VARIABLE THRESHOLD VOLTAGE DRAM CELL

BACKGROUND OF THE INVENTION

1. Field of the Invention

The present invention relates to semiconductor memory devices, and more specifically to variable threshold voltage memory cells for use in a semiconductor memory device.

2. Description of Related Art

Most dynamic random access memory (DRAM) devices use memory cells that each consist of one transistor and one capacitor to store charge as an indication of the stored information (i.e., binary state). Conventional DRAMs utilize either trench capacitors, which are formed by digging deep into the substrate, or stack capacitors, which are fabricated above the surface of the substrate in the dielectric and interconnect region of the device. Additionally, conventional DRAMs are formed with some combination of poly-silicon for the plates of the capacitor and a nitrided oxide for the dielectric.

An essential requirement in scaling the area of DRAMs is a reduction in the area occupied by the transistors and capacitors of the memory cells. However, when reducing the area, the capacitor must be able to maintain approximately the same charge (typically 35–50 fC) and the transistor must maintain low currents (typically in the sub-fA range). More specifically, the amount of stored charge must remain constant while the area occupied by each capacitor decreases because of density demands. Likewise, the demand on the transistor's leakage current has become more stringent in order to prevent such leakage from occurring as the memory cell dimensions are reduced. Thus, the design of DRAMs having one transistor and one capacitor memory cells has become increasingly difficult.

Recently, it has been proposed to reduce the size requirements of the capacitors by replacing the conventional dielectric material with tantalum oxide, barium strontium titanate, or some other similar high dielectric material. However, the use of barium strontium titanate necessitates the use of specific noble metals such as platinum or conducting oxides such as iridium oxide. Other recent proposals reduce the memory cell dimensions by using a vertical structure that maintains low leakage while occupying a smaller area. For example, Pein et al. describe a reduced size EEPROM structure in H. Pein et al., "A 3-D sidewall flash EPROM cell and Memory Array", Tech. Dig. of IEDM 415 (1993), Hanafi et al. describe a reduced size, low power, high speed memory in H. Hanafi et al., "A Scalable Low Power Vertical Memory," Tech. Dig. of IEDM, 657 (1995), and a capacitor with vertical transistor cell is described by Sonouchi et al. in K. Sonouchi et al., "A Surrounding Gate Transistor (SGT) Cell for 64/256 Mbit DRAMs" Tech. Dig. of IEDM 23 (1989), which are herein incorporated by reference.

SUMMARY OF THE INVENTION

It is an object of the present invention to provide a memory cell in which the threshold voltage of the transistor is changed when charge is stored on the capacitor. A back-plane gate of the transistor is connected to the capacitor. The charge on the capacitor affects the conduction of the transistor through the potential of the back-plane. In preferred embodiments, the presence of charge on the capacitor increases the threshold voltage of the transistor. Thus, there is a lower leakage current in the transistor when charge is stored on the capacitor.

Another object of the present invention is to provide a semiconductor memory device in which storage of charge on a memory cell capacitor influences the threshold voltage and thus the leakage characteristics of the memory cell access transistor. Each of the memory cells of the device has a back-plane underneath the access transistor channel, and the back-plane is connected to the capacitor. Thus, there are advantageous changes in the electrostatic potential within the access transistor when charge is stored on the capacitor.

One embodiment of the present invention provides a memory cell that includes a transistor and a capacitor. The transistor has a gate, a drain, a source, and a back-plane gate, and the capacitor has first and second electrodes. The back-plane gate of the transistor is connected to the first electrode of the capacitor. In a preferred embodiment, the capacitor is formed in the substrate and the source of the transistor is also connected to the first electrode of the capacitor.

Another embodiment of the present invention provides a memory cell that includes a transistor and a capacitor. The transistor has a gate, a drain, a source, and a back-plane gate, and the capacitor has first and second electrodes. The first electrode of the capacitor is connected to the source of the transistor, and the back-plane gate changes the threshold voltage of the transistor in correspondence to charge stored on the capacitor. In one preferred embodiment, the capacitor is formed above the substrate.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
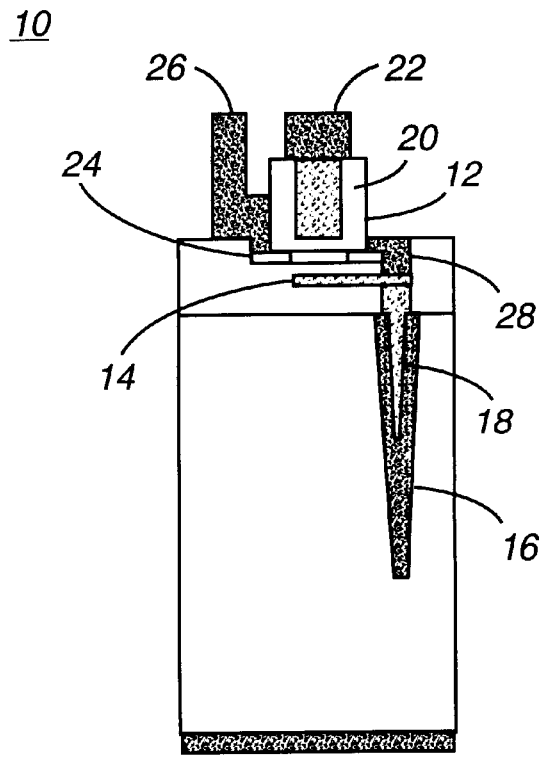
FIG. 1 is a diagram showing a cross-section of a portion of a memory device according to a first embodiment of the present invention.

A cross-section of a memory cell according to a first embodiment of the present invention is shown in FIG. 1. The memory cell 10 includes an access transistor 12 and a capacitor 16 connected in series. The gate 20 of the transistor 12 is connected to a word line 22 of the memory device, and the drain 24 of the transistor 12 is connected to a bit line 26 of the memory device. A back-plane (or floating) gate 14 is provided opposite to the channel of the transistor 12, and the capacitor 16 is formed underneath the transistor. One plate 18 of the capacitor 16 is connected to the drain 18 and the back-plane gate 14 of the transistor (e.g., through etching and deposition).

In the embodiment of FIG. 1, the capacitor is illustratively buried in the substrate to one side of the transistor. However, in alternative embodiments the capacitor is located underneath the transistor so that each memory cell occupies less space. During operation of the memory device, the connection of the back-plane gate to one of the plates of the capacitor causes any charge stored on the capacitor to influence the threshold voltage and conduction characteristics of the transistor. In particular, the presence of a charge on the capacitor increases the threshold voltage and lowers the leakage current of the transistor.

Figure 2:
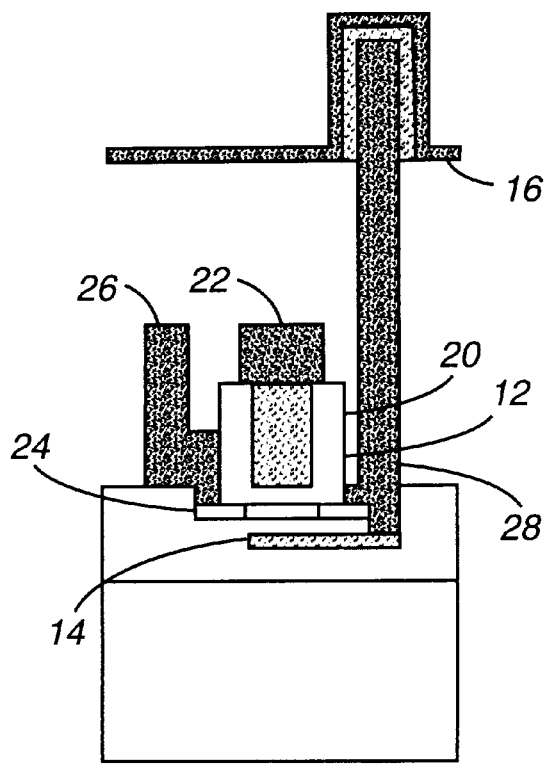
FIG. 2 is a diagram showing a cross-section of a portion of a memory device according to a second embodiment of the present invention.

FIG. 2 shows a cross-section of a memory cell according to a second embodiment of the present invention. In this embodiment, the back-plane gate 14 is also located opposite to the channel of the transistor 12, but the capacitor 16 is formed above the transistor 12 as a stack capacitor. In other respects, the memory cell is similar to the memory cell of the first embodiment. (The similar elements in the two figures are represented by the same reference numerals and a duplicative description thereof is omitted.)

Figure 3:
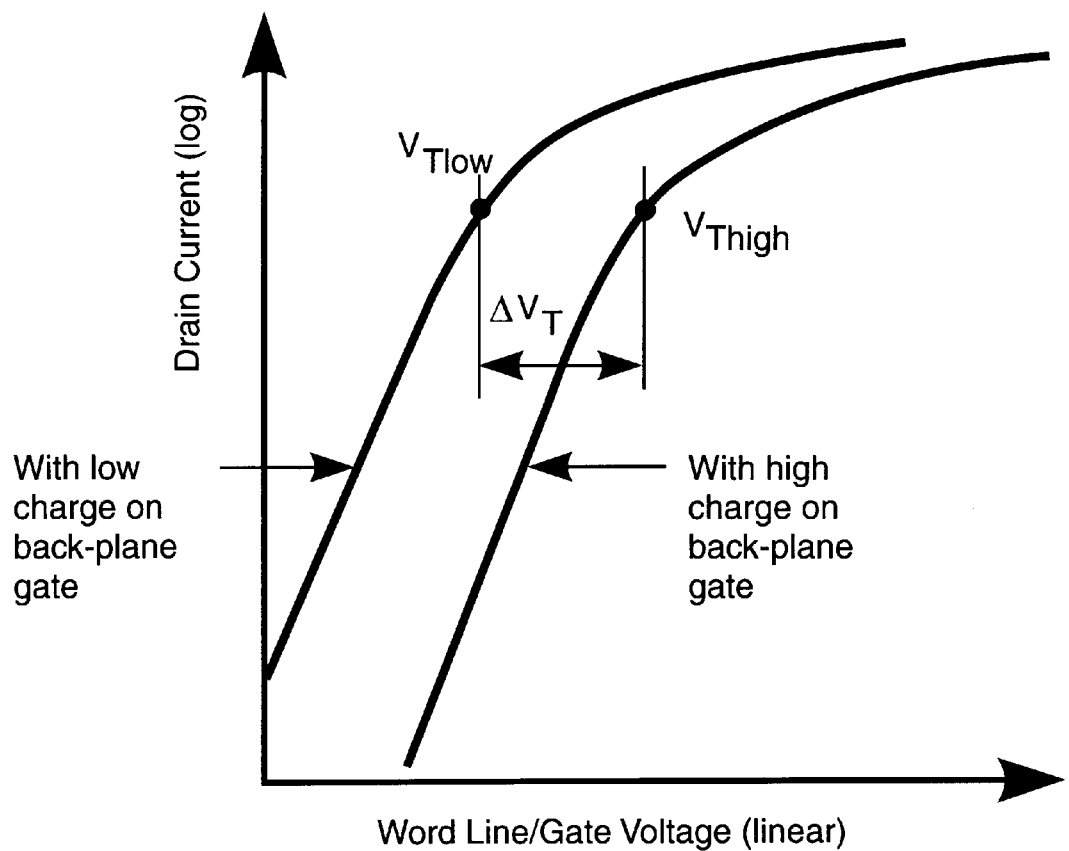
FIG. 3 is a graph showing leakage current characteristics in a memory device according to a preferred embodiment of the present invention.

FIG. 3 shows the transfer characteristics (i.e., drain-to-source current and gate-to-source voltage) of the transistor in a memory cell according to a preferred embodiment of the present invention. The two lines show the difference in the transfer characteristics of the transistor when no charge is on the capacitor and when charge is stored on the capacitor. As shown, the storage of charge (i.e., electrons) on the capacitor increases the threshold voltage of the transistor and improves its leakage current and sub-threshold slope. Thus, the stored charge itself reduces the rate at which it is removed through leakage.

Figure 4A:
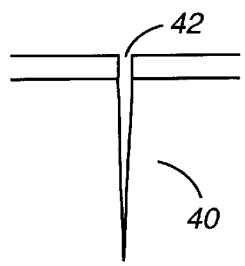
FIGS. 4(a) through 4(g) are diagrams showing a process for forming the memory device of the type shown in FIG. 1.
Figure 4B:
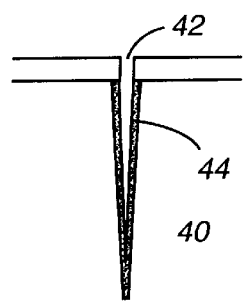
Figure 4C:
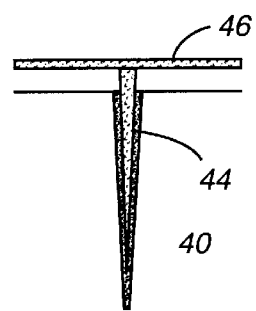

FIGS. 4(a) through 4(g) show a process for forming a memory cell with a buried capacitor in accordance with an embodiment of the present invention. First, as shown in FIG. 4(a), the trench 42 for the capacitor is etched in an oxidized silicon substrate 40. Then, the high doping for the bottom plate 44 of the capacitor is formed through heat treatment from a doped oxide/glass that is deposited and then stripped off, as shown in FIG. 4(b). Next, the inter-plate dielectric is grown and a doped top plate 46 is filled into the trench and coated over the whole wafer, as shown in FIG. 4(c). In preferred embodiments, the top plate 46 is polished to a roughness of better than 0.5 nm.

Figure 4D:
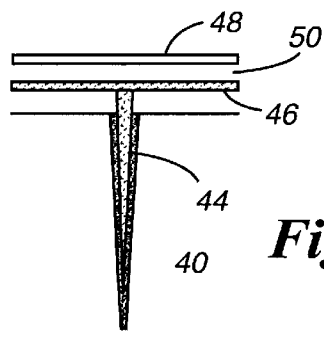

The above-described process for forming the memory cell capacitors is similar to the conventional process for forming trench capacitors for DRAMs. A silicon-oxide stack is then attached to the top plate 46 by a bonding process such as the one described in U.S. patent application Ser. No. 09/072,294, filed May 4, 1998 ("Method For Making Bonded Metal Back-Plane Substrates" by Tiwari et al.), which is herein incorporated by reference. After bonding and removal of the sacrificial layer, the structure has a thin single crystal layer of silicon 48 above the back-plane layer with an intervening oxide 50 and a capacitor further below, as shown in FIG. 4(d).

Figure 4E:
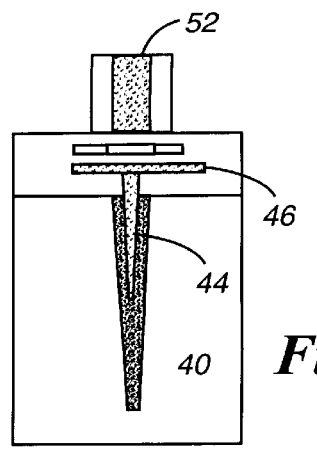
Figure 4F:
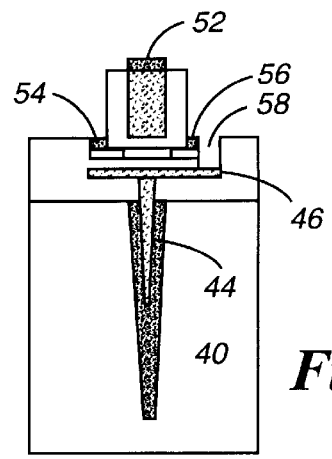
Figure 4G:
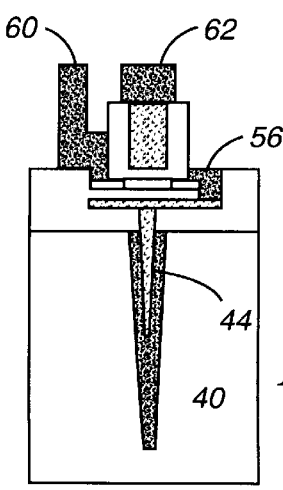

Next, the transistor is formed with its source connected to the back-plane that also forms one of the electrode of the capacitor. In particular, as shown in FIG. 4(e), double isolation is provided for the back-plane gate 46 and silicon channel of different transistors, and the gate 52 is oxidized and defined. The source and drain regions 54 and 56 are also defined, and a via 58 is etched to allow the connection of the drain to the back-plane, as shown in FIGS. 4(f) and 4(g). Next, as shown in FIG. 4(g), the back-gate 46 and source 56 are connected, and the bit line 60 and word line 62 are connected to the drain and gate, respectively.

Figure 5A:
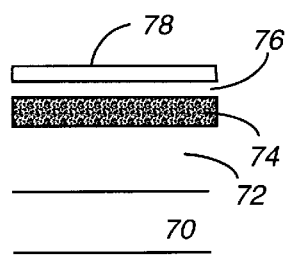
FIGS. 5(a) through 5(g) are diagrams showing a process for forming the memory device of the type shown in FIG. 2.
Figure 5E:
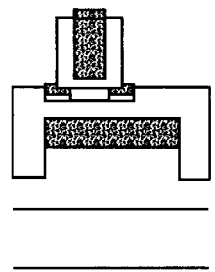
Figure 5B:
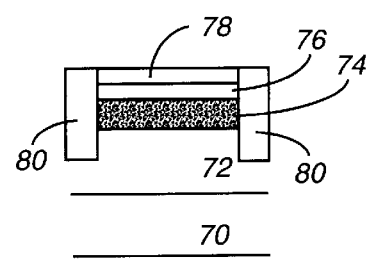
Figure 5F:
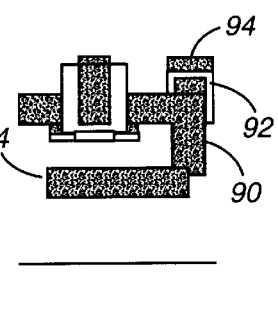
Figure 5C:
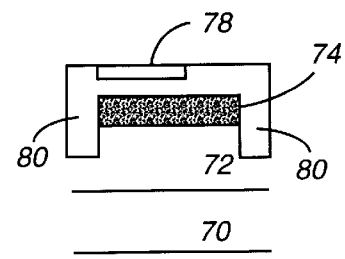
Figure 5D:
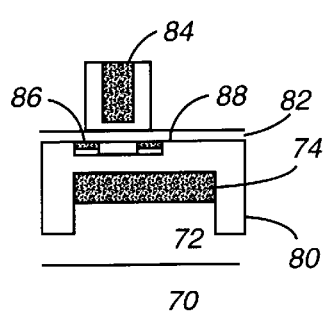
Figure 5G:
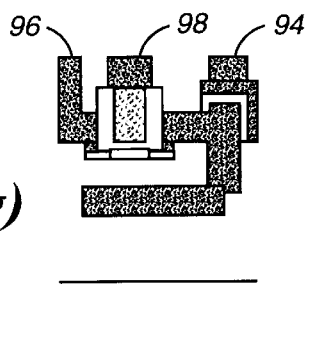

FIGS. 5(a) through 5(g) show a process for forming a memory cell with a stack capacitor in accordance with an embodiment of the present invention. The transistor with the back-plane is first formed using techniques such as the one described in the above-mentioned U.S. Patent Application on back-plane substrates by Tiwari et al. In particular, a buried oxide 72, back plane 74, back oxide 76, and silicon layer 78 are formed on a substrate 70, as shown in FIG. 5(a). Next, inter-transistor isolation 80 is formed, and then a second insulation is formed, as shown in FIGS. 5(b) and 5(c). A gate oxide layer 82, a gate electrode 84, and source and drain regions 86 and 88 are then formed, as shown in FIG. 5(d). Then, sidewalls, contact implants, silicide, vias, and contacts are formed, as shown in FIG. 5(e). After the transistor is formed, the back-plane must be connected to the source and a stack capacitor formed. For this purpose, the bottom plate of the capacitor 90 is formed so as to be connected to the back gate 74 and source 88, as shown in FIG. 5(f). Then, the capacitor dielectric 92 and top plate 94 are formed. Next, as shown in FIG. 5(g), the top plate 94 of the capacitor is connected to ground, and the bit line 96 and word line 98 are connected to the drain and gate, respectively.

Accordingly, the present invention provides a memory cell in which the threshold voltage of the access transistor is changed when charge is stored on the capacitor. A back-plane gate of the transistor is connected to one of the plates of the capacitor. Thus, the charge on the capacitor affects the conduction (i.e., threshold value) of the transistor through the potential of the back-plane. In preferred embodiments, the presence of charge on the capacitor increases the threshold voltage of the transistor to produce a lower leakage current when charge is stored on the capacitor.

In some embodiments of the present invention, the transistor and capacitor are formed one above the other in order to allow increased packing density through a significant reduction in the area of the memory cell. In preferred embodiments, the back-plane gate is a semiconductor or metal such as tungsten, silicon, or other similar non-reactive with oxide, and the inter-electrode material of the capacitor is a dielectric or ferroelectric. In further embodiments of the present invention, the back-plane gate is charged from the overlying transistor by a tunneling process. Other design choices, such as the type and placement of the transistor and capacitor, the cell interconnections, and the specific materials and dimensions used, could easily be adapted by one of ordinary skill in the art. Furthermore, embodiments of the present invention may not include all of the features described above.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A memory cell comprising:
   a transistor having a gate, a drain, a source, and a back-plane gate, and
   a capacitor having first and second electrodes,
   wherein the back-plane gate of the transistor is connected to the first electrode of the capacitor.

2. The memory cell as defined in claim 1, wherein the source of the transistor is also connected to the first electrode of the capacitor.

3. The memory cell as defined in claim 2, wherein the gate of the transistor is connected to a word line and the drain of the transistor is connected to a bit line.

4. The memory cell as defined in claim 1, wherein the capacitor is located beneath the transistor.

5. The memory cell as defined in claim 1, wherein the capacitor is a trench capacitor formed in the substrate.

6. The memory cell as defined in claim 1, wherein the capacitor is a stack capacitor that is formed above the substrate.

7. The memory cell as defined in claim 1, wherein the back-plane gate of the transistor is formed of tungsten or silicon with oxide.

8. The memory cell as defined in claim 1, wherein a dielectric or ferroelectric material is located between the first and second plates of the capacitor.

9. A semiconductor memory device comprising:
   a plurality of memory cells arranged substantially in a matrix of rows and columns;
   a plurality of bit lines each connected to the memory cells in one of the rows; and
   a plurality of word lines each connected to the memory cells in one of the columns,
   wherein at least one of the memory cells includes:
      a transistor having a gate, a drain, a source, and a back-plane gate; and
      a capacitor having first and second electrodes, the back-plane gate of the transistor being connected to the first electrode of the capacitor.

10. The semiconductor memory device as defined in claim 9, wherein in the at least one memory cell, the source of the transistor is also connected to the first electrode of the capacitor.

11. The semiconductor memory device as defined in claim 10, wherein in the at least one memory cell, the gate of the transistor is connected to one of the word lines and the drain of the transistor is connected to one of the bit lines.

12. The semiconductor memory device as defined in claim 9, wherein in the at least one memory cell, the capacitor is located beneath the transistor.

13. The semiconductor memory device as defined in claim 9, wherein in the at least one memory cell, the capacitor is a trench capacitor formed in the substrate.

14. The semiconductor memory device as defined in claim 9, wherein in the at least one memory cell, the capacitor is a stack capacitor that is formed above the substrate.

15. The semiconductor memory device as defined in claim 9, wherein in the at least one memory cell, the back-plane gate of the transistor is formed of tungsten or silicon with oxide.

16. The semiconductor memory device as defined in claim 9, wherein in the at least one memory cell, a dielectric or ferroelectric material is located between the first and second plates of the capacitor.

17. A memory cell comprising:
   a transistor having a gate, a drain, a source, and a back-plane gate; and
   a capacitor having first and second electrodes, the first electrode being connected to the source of the transistor,
   wherein the back-plane gate changes the threshold voltage of the transistor in correspondence to charge stored on the capacitor.

18. The memory cell as defined in claim 17, wherein the first electrode of the capacitor is also connected to the back-plane gate.

19. The memory cell as defined in claim 17, wherein the capacitor is a trench capacitor located beneath the transistor.

20. The memory cell as defined in claim 17, wherein the capacitor is a stack capacitor that is formed above the substrate.

* * * * *